Feb. 10, 1970 W. J. J. CHECINSKI 3,495,039
AMPLIFIER
Filed March 7, 1966
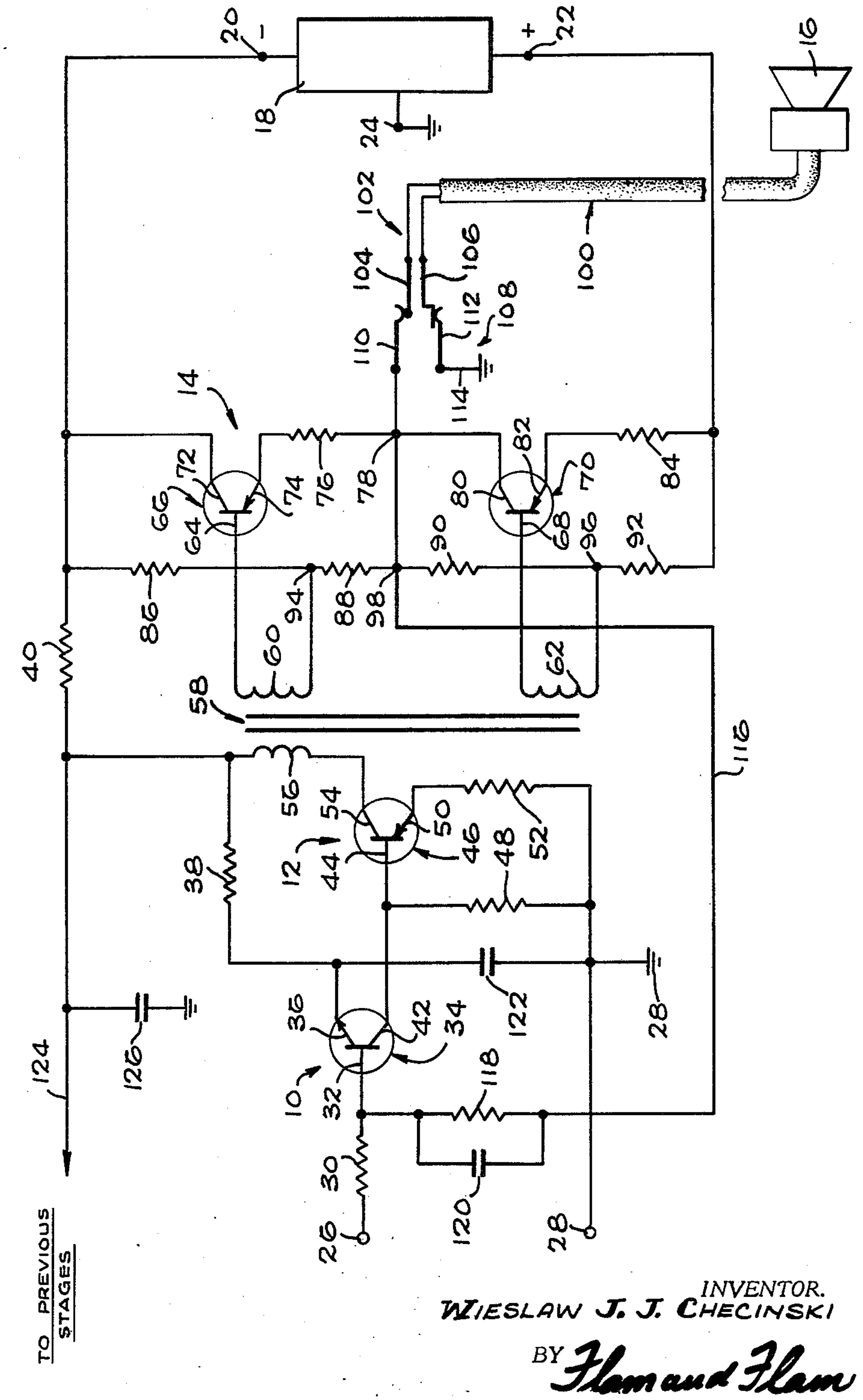
INVENTOR.
WIESLAW J. J. CHECINSKI
BY Flam and Flam
ATTORNEY United States Patent Office 3,495,039
Patented Feb. 10, 1970

3,495,039
AMPLIFIER

Wieslaw J. J. Checinski, North Hollywood, Calif., assignor to Newcomb Electronics Corp., Los Angeles, Calif., a corporation of California Filed Mar. 7, 1966, Ser. No. 532,291
Int. Cl. H04m 1/62; H03f 1/34, 3/04
U.S. Cl. 179—1 7 Claims

ABSTRACT OF THE DISCLOSURE

A cascade transistor amplifier having a single-ended input stage and a push-pull output stage. The output stage has a common output terminal and means to connect a load, such as a loudspeaker, between the common output terminal and a point of reference potential. A balanced direct current supply is provided for the push-pull output stage, and the single-ended stage is connected across only one side of the power supply. A feedback connection is provided between the common output terminal and an input electrode of the single-ended input stage and normally provides a bias of one polarity. When the load becomes disconnected from the common terminal, the polarity of the bias reverses; and the input stage transistor becomes saturated to prevent alternating current signals from being applied to the push-pull output stage. In order to further insure that alternating current signals do not reach the output stage, a large capacitor is connected to become effectively coupled across the signal path upon saturation of the input stage.

This invention relates to amplifiers and, more particularly, to the protection of transistor amplifiers employed in loudspeaker systems.

Transistor amplifiers of the push-pull type are frequently employed to drive loudspeakers. In one common circuit, the loudspeaker is connected between a common output terminal of a push-pull stage and a ground or reference point. In certain situations, the loudspeaker will be employed at a public event, such as a dance or lecture, which requires that it be located remotely from the amplifier. The loudspeaker will then be subject to accidental disconnection from the amplifier as when someone inadvertently trips over the cable. This will result in a condition in which the push-pull stage of the amplifier will be floating. If an audio signal is received when this condition exists, the output stage of the amplifier will be overdriven by the audio frequency alternating current signal which will possibly cause the output stage transistors to be damaged irreparably.

It has been suggested in the prior art that a transistor amplifier output stage could be protected from being overdriven by biasing an input stage to non-conduction. It has been found, however, that the use of such a cut-off bias is unreliable, and the bias circuit required for this purpose tends to be quite complicated.

It is accordingly the principal object of this invention to provide an improved amplifier circuit and more particularly an amplifier circuit which avoids the foregoing problems.

More specifically, it is an object of this invention to provide circuit means which prevents the disconnection of a loudspeaker or other load from an amplifier of the aforementioned type from damaging the output stage transistors.

Another object of the invention is the provision of a cascade amplifier having means responsive to a condition of a load for saturating the input stage.

A further object is the provision of a cascade amplifier having means for saturating an input stage upon the disconnection of a load from the output stage.

Still another object is the provision of an amplifier having a push-pull output stage normally having a load connected between a common terminal and a ground terminal and having feedback means from the common terminal to a previous stage to cause said previous stage to block an alternating current signal upon disconnection of the load from the common terminal.

An additional object relates to the provision of a circuit for blocking an alternating current signal comprising an amplifying device, a large capacitor, and means for saturating the amplifying device to connect the large capacitor across the signal path.

A further additional object of the invention pertains to the provision of an amplifier having an output terminal and means providing a feedback signal from the output terminal of one polarity when a load is connected to the terminal and of a second polarity when a load is disconnected from the terminal.

Briefly, the invention contemplates the provision of a cascade transistor amplifier having a single-ended input stage and a push-pull output stage. The output stage has a common output terminal and means to connect a load, such as a loudspeaker, between the common output terminal and a point of reference potential. A balanced direct current supply is provided for the push-pull output stage, and the single-ended stage is connected across only one side of the power supply. A feedback connection is provided between the common output terminal and an input electrode of the single-ended input stage and normally provides a bias of one polarity. When the load becomes disconnected from the common terminal, the polarity of the bias reverses; and the input stage becomes saturated to prevent alternating current signals from being applied to the push-pull output stage. In order to further insure that alternating current signals do not reach the output stage, a large capacitor is connected to become effectively coupled across the signal path upon saturation of the input stage.

These and other objects, advantages and features of the invention will become more readily apparent from a consideration of the attached drawing in which the single figure is a circuit diagram of an amplifier of the invention.

Turning to the drawing, it will be seen that an amplifier according to the present invention comprises a first stage of amplification 10 which will be referred to hereinafter as the input stage although it may be preceded by one or more additional stages of amplification, an intermediate stage of amplification 12, an output stage of amplification 14, a loudspeaker load device 16 and a power supply 18.

The power supply is a balanced direct current supply and has a first negative terminal 20, a second positive terminal 22, and a third ground terminal 24. As will become more readily apparent hereinafter, the single-ended stages of the amplifier are connected to the negative side of the balanced power supply, while the push-pull stage 14 is connected to both sides of the supply.

An audio frequency alternating current signal is applied between an input terminal 26 and a ground terminal 28 of stage 10. An input resistor 30 is connected between terminal 26 and the base electrode 32 of a NPN transistor 34. The emitter electrode 36 is connected through a resistor 38 and a resistor 40 to the negative terminal 20 of the power supply, which thus provides the bias for this transistor. The collector electrode 42 serves as the output electrode of the transistor and is directly connected to the base electrode 44 of a PNP transistor 46, which forms the amplifying device of the second stage of amplification 12. A resistor 48 is connected between base electrode 44 and ground connection 28. The emitter electrode 50 of transistor 46 is coupled to ground connection 28 through a resistor 52. The collector electrode 54 of transistor 46 serves as the output electrode of stage 12 and is connected to a primary winding 56 of an output stage driving transformer 58.

This transformer has the function of providing a transition between single-ended stage 12 and double-ended stage 14. This is accomplished by the provision of a pair of secondary windings 60 and 62 which are coupled to opposite sides of the push-pull stage. Secondary winding 60 is connected to the base electrode 64 of a PNP transistor amplifying device 66, while secondary winding 62 is connected to the base electrode 68 of a PNP transistor amplifying device 70. The transistor amplifying devices 66 and 70 are, in effect, connected in series between terminals 20 and 22 of the power supply 18 with collector electrode 72 of transistor 66 being connected directly to terminal 20. Emitter electrode 74 of transistor 66 is connected through a resistor 76 to a common output terminal 78 of the amplifier. The collector electrode 80 of transistor 70 is also connected to output terminal 78, and emitter electrode 82 of this transistor is connected to the positive terminal 22 of the power supply through a resistor 84.

Four additional resistors 86, 88, 90 and 92 are connected in series between terminals 20 and 22 of the power supply. It will be noted that the end of winding 60 opposite to that connected to base 64 is connected to the junction 94 between resistors 86 and 88, while the opposite end of winding 62 from the end connected to base electrode 68 is connected to the junction 96 between resistors 90 and 92. The junction 98 between resistors 88 and 90 is connected to output terminal 78.

As previously mentioned, the loudspeaker 16 may be remotely located with respect to the amplifier. This is accomplished by means of a cable 100, one end of which is connected to loudspeaker 16 and the other end of which is connected to a jack 102 having a first terminal 104 and a second terminal 106. This jack is inserted into a plug 108 having a terminal 110 and a terminal 112. The terminal 110 is connected to common output terminal 78, and terminal 112 is connected to ground at 114.

As will be explained more fully hereinafter, a feedback connection 116 from output terminal 78 serves to set the operating conditions of input stage transistor 34. The feedback loop is completed through the parallel connection of resistor 118 and capacitor 120 which are, as will be evident from the figure, connected to the base electrode 32 of transistor 34.

It is to be noted in addition that a large capacitor 122, whose function will become apparent from the description of the operation of the circuit to follow, is connected between collector electrode 36 of transistor 34 and ground connection 28.

Since, as previously mentioned, input stage 10 may be preceded by one or more additional stages of amplification, bias voltage for previous stages is provided on a lead 124 connected to terminal 20 of power supply 18 through resistor 40. A smoothing capacitor 126 is connected between this lead and ground.

In considering the operation of the circuit, it is to be noted that the single-ended stages 10 and 12, preceding the push-pull stage 14, are connected across only one side of the balanced power supply 18, more specifically being connected between negative terminal 20 and ground terminal 24 of the power supply. Accordingly, the current drawn by the single-ended stages tends to unbalance the power supply as applied to the push-pull stage so that point 78 will be slightly positive rather than being at the nominal zero potential of a balanced power supply. Thus, there will be a voltage drop across the load 16 which will be in the nature of about one-half volt under normal alternating current signal operating conditions. This voltage drop across the load is used to bias the input transistor 34 at its base electrode 32 for conduction.

The load 16 is also used as part of the feedback loop including lead 116 and resistor 118 and capacitor 120.

Under normal operating conditions with no audio output and no driving of the output transistors 66 and 70, point 78 remains at substantially zero potential. This is so because the current being drawn through the load 16, is very slight. Since the output resistance of speaker 16 is only about 8 ohms, a very small voltage drop, which may be considered as effectively zero, is produced at terminal 78 so that terminal 78 may be regarded as remaining at zero potential.

However, during normal driving conditions, when an input alternating current signal is applied between terminals 26 and 28, sufficient current will be drawn through the push-pull output transistors 66 and 70 that the direct current voltage drop across load 16 will increase to such a value at terminal 78 that about −200 millivolts will be applied at the base of transistor 34. The drop across the speaker impedance is actually substantially greater, because both direct current and alternating current voltages are present across the speaker. Resistor 118 is of the order of 150 kilohms and serves to reduce the potential applied to base 32 of transistor 34 from the higher potential developed across load 16. The negative 200 millivolts appearing at the base electrode 32 of transistor 34 is sufficient bias for conduction of transistor 34.

If we now consider that the speaker 16 is disconnected, either accidentally as by someone tripping over cable 100 or deliberately, at the same time that an alternating current signal is being applied continuously through output transistors 66 and 70, it will be noted that a positive cycle surge at output terminal 78 is reflected back to the base electrode 32 of transistor 34 and causes transistor 34 to saturate. This will cause a decrease in the alternating current signal applied to transistor 46 and thence to push-pull stage 14. This is then reflected back to transistor 34 by the feedback loop as a decreased signal which further decreases the alternating current swing of the output of transistor 34. This process continues in sequentially diminishing cycles until the signal applied to stage 14 becomes zero, and the alternating current effect is effectively shut off. A bias of +600 millivolts will now appear at the base 32 of transistor 34 and cause complete saturation of transistor 34. Transistor 34 will thus operate as a short circuit for alternating current connected between resistor 38 and resistor 48. Hence, it will be seen that no alternating current signal can be developed across or be amplified by transistor 34 so that, with the speaker 16 disconnected, we reach a quiescent condition wherein transistor 34 remains fully saturated.

This is a great improvement over the prior art technique of biasing the input transistor into a non-conducting condition. The extremely small voltages required in the biasing of transistors make the use of a negative cut-off bias unreliable. In the present invention, on the other hand, a positive conducting bias, which is easily and reliably obtained, causes saturation rather than cut-off to short circuit the alternating current signal and thereby eliminate the driving of the output amplifier for the protection thereof. If a negative cut-off bias were employed, the circuit would become very complicated and require extensive additional circuitry. A small shift in the bias voltage could cause the signal to be clipped. For example, if, with −200 millivolts as bias on base 32 of transistor 34, the transistor operates in class A, a bias of only −100 millivolts on the base would cause clipping of the alternating current signal on one side.

In order to insure that no alternating current signal reaches stages 12 and 14 of the amplifier, the capacitor 122 is made large enough that when transistor 34 becomes saturated, capacitor 122, being coupled across resistor 48 by virtue of the low impedance of saturated transistor 34, will short circuit the alternating current signal input to amplifier stage 12 to ground. Thus, no alternating current signal will be applied to the input electrode 44 of transistor 46.

Transistor 46 may continue to conduct after transistor 34 becomes saturated, because the only conduction of transistor 46 under such conditions will be of direct current. Transistor 46 is protected by means of resistor 52 to limit the current therethrough. Thus, over-driving of transistor 46 is of no concern. As for the push-pull output transistors 66 and 70, it is to be understood that they can handle the direct current levels with great ease. The quiescent direct current through the output transistors 66 and 70 is of the order of milliamps while, normally, these transistors operate in class B and can carry in the order of five amperes.

While a preferred embodiment of the invention has been shown and described, it will be apparent to those skilled in the art that changes can be made without departing from the principles and spirit of the invention, the scope of which is defined in the appended claims. Although the invention has been described with reference to a circuit employing transistors of the indicated conductivity types, it is to be understood that transistors of opposite conductivity types may be substituted. Thus, if PNP transistors are used instead of the disclosed NPN transistors and vice versa, the single-ended stages would be connected across the positive side of the balanced power supply 18. It is also to be understood that loads other than speakers may be employed as the load of the disclosed circuit. Accordingly, the foregoing embodiment is to be considered as illustrative rather than restrictive of the invention, and those modifications which come within the meaning and range of equivalency of the claims are to be included therein.

I claim.

1. A cascade amplifier for amplifying a signal, comprising:
   - a single balanced direct current power supply having a positive terminal, a negative terminal and an intermediate ground terminal;
   - a single-ended input stage comprising a first amplifying device and connected between one of said positive and negative terminals and said ground terminal for tending to unbalance said power supply, said first amplifying device having an input electrode;
   - a push-pull output stage coupled to the output of said input stage and comprising a second amplifying device connected to said positive terminal and a third amplifying device connected to said negative terminal, said second and third amplifying devices having a common output terminal;
   - a load for said output stage connected between said common terminal and said ground terminal, the condition of said load creating a bias voltage condition at said common terminal; and
   - feedback means connected between said common terminal and said input electrode of said first device for applying bias from said common terminal to said first device for controlling conduction of said first device in response to a condition of said load.

2. A cascade amplifier as defined in claim 1 wherein:
   - said signal is an alternating current signal;
   - said first, second and third devices are transistors;
   - said condition of said load comprises disconnection of said load from said common terminal, said disconnection of said load tending to cause said alternating current signal to overload said second and third transistors; and
   - said voltage condition created at said common terminal upon disconnection of said load biasing said first transistor to saturation thereby preventing said signal from passing said input stage and overloading said output stage.

3. A cascade amplifier as defined in claim 1 wherein said load condition comprises one of low resistance and infinite resistance.

4. A cascade amplifier as defined in claim 3 wherein said load condition is low resistance and said unbalancing of said power supply causes said load to maintain a first potential at said common terminal for biasing said first device for amplification conduction.

5. A cascade amplifier as defined in claim 4, wherein said signal is an audio-signal and said load is a loudspeaker.

6. A cascade amplifier as defined in claim 3 wherein said load condition is infinte resistance and said unbalancing of said power supply causes said common terminal to have a second potential for biasing said first device to saturation conduction.

7. A cascade amplifier as defined in claim 6 wherein said signal is an audio signal, said load is a loudspeaker, and said infinite resistance condition of said load comprises disconnection of said loudspeaker from one of said common and ground terminals.

References Cited

UNITED STATES PATENTS

| | | | |
|---|---|---|---|
| 3,376,388 | 4/1968 | Reiffin. | |
| 3,372,342 | 3/1968 | Reiffin. | |
| 3,320,543 | 5/1967 | Hopengarten et al. | 330—15 |
| 3,233,115 | 2/1966 | Chou | 330—15 |
| 3,142,807 | 7/1964 | Sharma | 330—15 |
| 3,114,112 | 12/1963 | Cochran | 330—26 |

KATHLEEN H. CLAFFY, Primary Examiner

C. JIRAUCH, Assistant Examiner

U.S. Cl. X.R.

330—15, 22, 83, 96, 127